United States Patent
Inoue et al.

(10) Patent No.: US 12,519,001 B2
(45) Date of Patent: Jan. 6, 2026

(54) MEMBER FOR SEMICONDUCTOR MANUFACTURING APPARATUS

(71) Applicant: NGK INSULATORS, LTD., Nagoya (JP)

(72) Inventors: Seiya Inoue, Handa (JP); Tatsuya Kuno, Nagoya (JP); Tomoyuki Minami, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 147 days.

(21) Appl. No.: 18/583,974

(22) Filed: Feb. 22, 2024

(65) Prior Publication Data

US 2025/0069929 A1  Feb. 27, 2025

Related U.S. Application Data

(63) Continuation of application No. PCT/JP2023/030114, filed on Aug. 22, 2023.

(51) Int. Cl.
*H01T 23/00* (2006.01)
*H01J 37/32* (2006.01)
*H01L 21/683* (2006.01)

(52) U.S. Cl.
CPC .... *H01L 21/6833* (2013.01); *H01J 37/32715* (2013.01); *H01J 2237/2007* (2013.01)

(58) Field of Classification Search
None
See application file for complete search history.

(56) References Cited

U.S. PATENT DOCUMENTS

| | | |
|---|---|---|
| 2008/0100985 A1 | 5/2008 | Hattori |
| 2014/0355170 A1 | 12/2014 | Wada et al. |
| 2017/0162416 A1* | 6/2017 | Miyazawa ........ H01J 37/32715 |
| 2022/0216086 A1* | 7/2022 | Ishikawa ........... H01J 37/32697 |

(Continued)

FOREIGN PATENT DOCUMENTS

| | | | |
|---|---|---|---|
| JP | 2008-135737 A | 6/2008 | |
| JP | 2012-039011 A | 2/2012 | |

(Continued)

OTHER PUBLICATIONS

International Search Report and Written Opinion (Application No. PCT/JP2023/030114) dated Nov. 7, 2023 (7 pages).

*Primary Examiner* — Stephen W Jackson
(74) *Attorney, Agent, or Firm* — BURR PATENT LAW, PLLC

(57) ABSTRACT

A member for semiconductor manufacturing apparatus includes a ceramic plate having a wafer placement surface on an upper surface, an electrostatic electrode embedded in the ceramic plate, an electrode lead-out portion embedded in the ceramic plate and extending downward from the electrostatic electrode, a terminal hole extending from a lower surface of the ceramic plate to the electrode lead-out portion, a terminal in the terminal hole, a conductive bonding portion located between the terminal and the electrode lead-out portion and bonding the terminal and the electrode lead-out portion together. The terminal hole has a terminal hole tapering surface that tapers toward a bottom of the hole, and the terminal hole tapering surface intersects a lateral surface of the electrode lead-out portion.

8 Claims, 6 Drawing Sheets

(56) References Cited

U.S. PATENT DOCUMENTS

| | | | |
|---|---|---|---|
| 2023/0055928 A1* | 2/2023 | Takebayashi | H01L 21/67126 |
| 2023/0057107 A1* | 2/2023 | Takebayashi | H01L 21/68757 |
| 2023/0141651 A1 | 5/2023 | Kawanabe et al. | |

FOREIGN PATENT DOCUMENTS

| | | |
|---|---|---|
| JP | 2012-049185 A | 3/2012 |
| JP | 2013-084938 A | 5/2013 |
| WO | 2021/075240 A1 | 4/2021 |

* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

A semiconductor manufacturing apparatus includes a member for semiconductor manufacturing apparatus such as a ceramic heater for heating wafers and an electrostatic chuck for adsorbing and holding wafers. PTL 1 discloses a member for semiconductor manufacturing apparatus of this type that has a structure of bonding a power feeding terminal to an electrode embedded in a ceramic plate. Specifically, an electrode lead-out portion extending downward from the electrode is embedded in the ceramic plate together with the electrode, the ceramic plate has a terminal hole extending from the lower surface to the electrode lead-out portion, and a terminal in this terminal hole is coupled to the electrode via the electrode lead-out portion. The electrode lead-out portion has a truncated conical shape, and the lateral surface has a slant angle of 40° or less. The terminal hole has a flat bottom surface that intersects the lateral surface of the electrode lead-out portion.

CITATION LIST

Patent Literature

PTL 1: JP 2008-135737 A

SUMMARY OF THE INVENTION

However, in the member for semiconductor manufacturing apparatus disclosed in PTL 1, the ceramic plate has a thin portion between the slanting lateral surface of the electrode lead-out portion and the flat bottom surface of the terminal hole, for example, and thus the portion may be damaged, for example, cracked or delaminated by a processing load or thermal stress in use.

The present invention was made to solve the above-described problem, and the main object thereof is to reduce damage in the member for semiconductor manufacturing apparatus.

[1] A member for semiconductor manufacturing apparatus according to the present invention comprises: a ceramic plate having a wafer placement surface on an upper surface; an electrode embedded in the ceramic plate; an electrode lead-out portion embedded in the ceramic plate and extending downward from the electrode; a terminal hole extending from a lower surface of the ceramic plate to the electrode lead-out portion; a terminal in the terminal hole; and a conductive bonding portion located between the terminal and the electrode lead-out portion and bonding the terminal and the electrode lead-out portion together, wherein the terminal hole has a terminal hole tapering surface that tapers toward a bottom of the terminal hole, and the terminal hole tapering surface intersects a lateral surface of the electrode lead-out portion.

In the member for semiconductor manufacturing apparatus, the terminal hole has a terminal hole tapering surface that tapers toward the bottom of the hole, and the terminal hole tapering surface intersects the lateral surface of the electrode lead-out portion. This allows the portion of the ceramic plate between the electrode lead-out portion and the terminal hole to be thicker by the amount corresponding to the amount of slant of the terminal hole tapering surface than a portion between a flat bottom surface of the terminal hole and the slanting lateral surface of the electrode lead-out portion intersecting each other. Thus, the ceramic plate is less likely to have a thin portion, reducing damage in the member for semiconductor manufacturing apparatus.

In this specification, terms such as up and down, left and right, and front and back may be used in explanation of the present invention. However, up and down, left and right, and front and back indicate only relative positional relationships. Thus, when the orientation of a member for semiconductor manufacturing apparatus is changed, up and down may become left and right, or left and right may become up and down without departing from the technical scope of the invention.

[2] In the member for semiconductor manufacturing apparatus according to the present invention (the member for semiconductor manufacturing apparatus according to the above [1]), the lateral surface of the electrode lead-out portion may taper toward a lower side. This can reduce the volume of the electrode lead-out portion with the sufficient contact area between the electrostatic electrode and the electrode lead-out portion being kept. The reduction in volume of the electrode lead-out portion reduces cracking and delamination of the ceramic plate caused by difference in thermal expansion between the ceramic plate and the electrode lead-out portion.

[3] In the member for semiconductor manufacturing apparatus according to the present invention (the member for semiconductor manufacturing apparatus according to the above [1] or [2]), at an intersection between the terminal hole tapering surface and the lateral surface of the electrode lead-out portion, an angle between a virtual plane parallel to the electrode and the terminal hole tapering surface may be 20° or greater and 75° or less. When the angle is 20° or greater, the ceramic plate is less likely to have a thin portion, and thus cracking and delamination of the ceramic plate can be further reduced. When the angle is 75° or less, the terminal hole can have a relatively large diameter, even if the bottom of the terminal hole is made small to match the size of the electrode lead-out portion, for example. This enables a terminal having a larger diameter to be in the terminal hole, ensuring high conductivity.

[4] In the member for semiconductor manufacturing apparatus according to the present invention (the member for semiconductor manufacturing apparatus according to any one of the above [1] to [3]), an intersection angle between the terminal hole tapering surface and the lateral surface of the electrode lead-out portion may be 40° or greater and 120° or less. When the intersection angle is 40° or greater, the ceramic plate is less likely to have a thin portion, and thus cracking and delamination of the ceramic plate can be further reduced. When the intersection angle is 120° or less, the terminal hole can have a relatively large diameter, even if the bottom of the terminal hole is made small to match the size of the electrode lead-out portion, for example. This enables a terminal having a larger diameter to be in the terminal hole, ensuring high conductivity.

[5] In the member for semiconductor manufacturing apparatus according to the present invention (the member for semiconductor manufacturing apparatus according to any one of the above [1] to [4]), the lateral surface of the electrode lead-out portion may taper toward a lower side, and the lateral surface of the electrode lead-out portion may have a slant angle smaller than the intersection angle between the terminal hole tapering surface and the lateral surface of the electrode lead-out portion. The volume of the electrode lead-out portion decreases as the slant angle of the lateral surface of the electrode lead-out portion decreases, and thus cracking and delamination of the ceramic plate caused by difference in thermal expansion between the ceramic plate and the electrode lead-out portion can be further reduced.

[6] In the member for semiconductor manufacturing apparatus according to the present invention (the member for semiconductor manufacturing apparatus according to any one of the above [1] to [5]), the terminal hole tapering surface may have a portion in the electrode lead-out portion. With this configuration, the contact area between the electrode lead-out portion and the conductive bonding portion can be readily secured, improving the conducting properties.

[7] In the member for semiconductor manufacturing apparatus according to the present invention (the member for semiconductor manufacturing apparatus according to any one of the above [1] to [6]), the terminal hole tapering surface may be a C-chamfered surface or an R-chamfered surface located between a bottom surface and a lateral surface of the terminal hole.

[8] In the member for semiconductor manufacturing apparatus according to the present invention (the member for semiconductor manufacturing apparatus according to any one of the above [1] to [7]), the terminal hole tapering surface may be a C-chamfered surface located between a bottom surface and a lateral surface of the terminal hole, the terminal may have a terminal tapering surface that tapers toward a tip of the terminal, and the terminal tapering surface is a C-chamfered surface located between a front-end surface and a lateral surface of the terminal, and the terminal hole tapering surface and the terminal tapering surface may be bonded together by the conductive bonding portion. With this configuration, the C-chamfered terminal tapering surface can be received by and bonded to the C-chamfered terminal hole tapering surface. This reduces concentration of the pressing force applied by the terminal on the bottom surface of the terminal hole, reducing cracking and delamination of the ceramic plate around the bottom surface of the terminal hole. From the viewpoint of even distribution of the pressing force applied by the terminal, the C-chamfered surface of the terminal hole tapering surface and the C-chamfered surface of the terminal tapering surface are preferably similar in size, and the C-chamfered surface of the terminal hole tapering surface and the C-chamfered surface of the terminal tapered surface are preferably similar in slant angle.

DETAILED DESCRIPTION OF THE INVENTION

Figure 1:
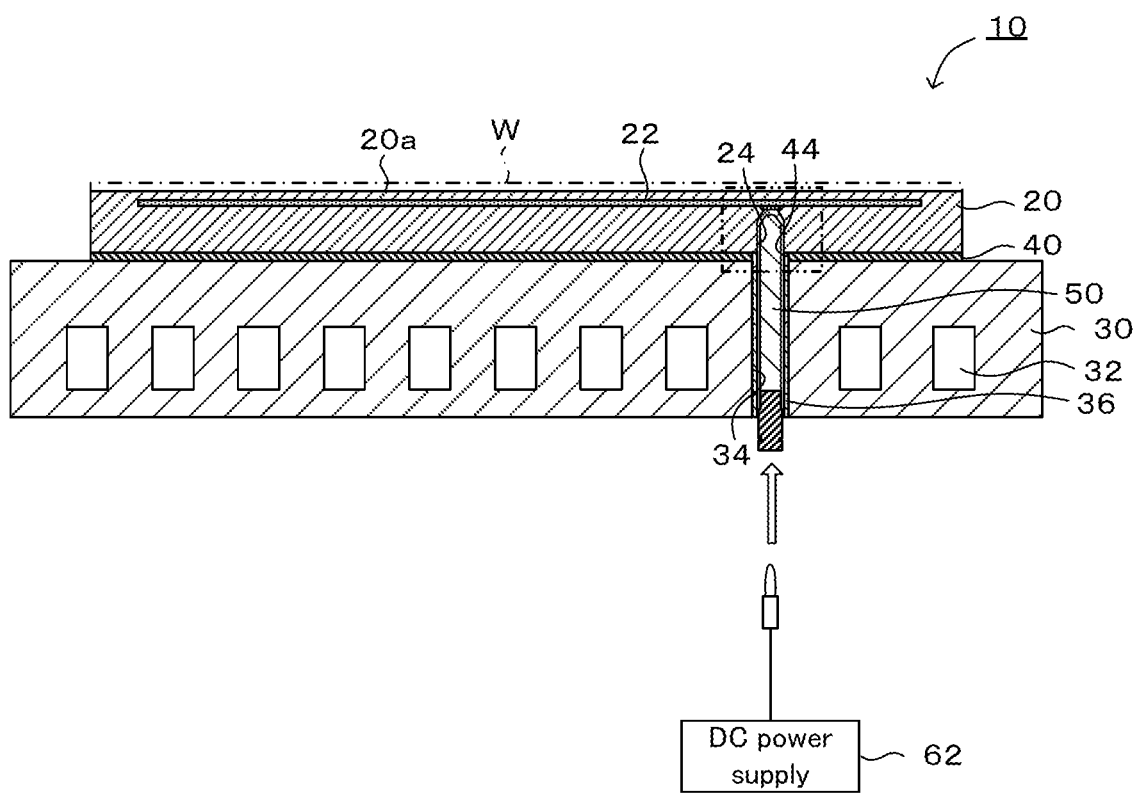
FIG. 1 is a cross-sectional view illustrating a schematic configuration of a wafer placement table 10.
Figure 2:
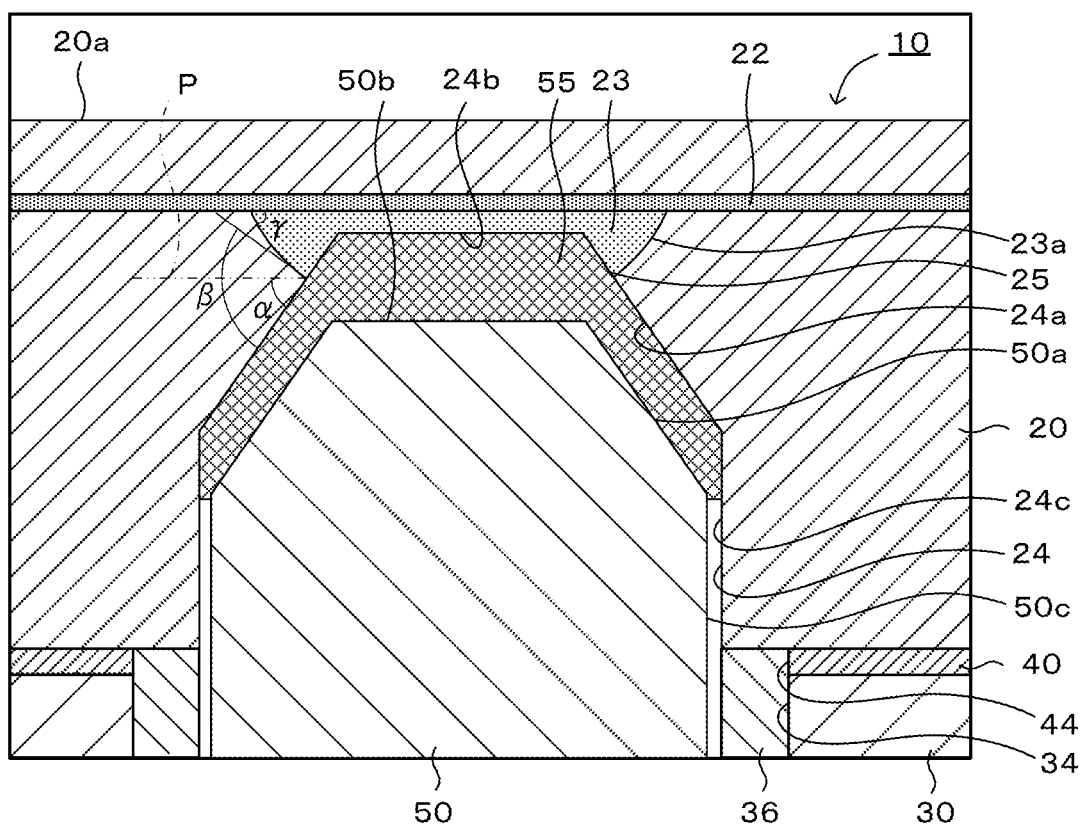
FIG. 2 is a partial magnified view of FIG. 1.

FIG. 1 is a cross-sectional view illustrating a schematic configuration of a wafer placement table 10 of this embodiment (cross-sectional view taken along a plane extending along the central axis of the wafer placement table 10). FIG. 2 is a partial magnified view of FIG. 1 (magnified view of a boxed portion indicated by a two-dot-dash line). In the following description, terms such as up and down, left and right, and front and back may be used, but such terms indicate only relative positional relationships.

The wafer placement table 10 is an example of a member for semiconductor manufacturing apparatus that processes wafers W. As illustrated in FIG. 1, the wafer placement table 10 includes a ceramic plate 20, a cooling plate 30, a bonding layer 40, and a terminal 50.

The ceramic plate 20 is a disc-shaped member and has a wafer placement surface 20a on the upper surface. The ceramic plate 20 is formed of a ceramic-containing material. The ceramic-containing material contains a ceramic as a main component and may contain, in addition to the ceramic, components derived from sintering aids (e.g., rare earth elements) and inevitable components. The "main component" accounts for greater than or equal to 50% by mass of the total. The ceramic may be, for example, alumina or aluminum nitride.

An electrostatic electrode 22 is embedded in the ceramic plate 20. The electrostatic electrode 22 is formed of a material containing a metal, such as W, Mo, WC, or MoC. The metal forming the electrostatic electrode 22 preferably has a coefficient of thermal expansion close to that of the ceramic plate 20. The electrostatic electrode 22 may contain the ceramic contained in the ceramic plate 20 such that the coefficient of thermal expansion of the electrostatic electrode 22 becomes closer to that of the ceramic plate 20. The electrostatic electrode 22 is a disc-shaped or mesh-patterned unipolar electrostatic electrode. The layer of the ceramic plate 20 above the electrostatic electrode 22 serves as a dielectric layer. A DC power supply 62 for electrostatic attraction is coupled to the electrostatic electrode 22 via the terminal 50.

The cooling plate 30 is a disc-shaped member internally having a refrigerant flow path 32 through which a refrigerant can circulate. The refrigerant flow path 32 extends in a one-stroke pattern from one end to the other end over the entire area of the ceramic plate 20 in plan view. The one end and the other end of the refrigerant flow path 32 are connected to a refrigerant circulation pump (not illustrated) that can regulate the temperature of the refrigerant. The cooling plate 30 is formed, for example, of a conductive material containing metal. Examples of the conductive material include composite materials and metal. An example of the composite materials is a metal composite material (also called a metal matrix composite (MMC)), for example. Examples of MMC include a material containing Si, SiC, and Ti and porous SiC materials impregnated with Al and/or Si. A material including Si, SiC, and Ti is referred to as SiSiCTi, a material including a porous SiC material impregnated with Al is referred to as AlSiC, and a material including a porous SiC material impregnated with Si is referred to as SiSiC. Examples of the metal include Al, Ti, Mo, and alloys of them. The conductive material of the cooling plate 30 preferably has a coefficient of thermal expansion close to that of the ceramic plate 20.

The bonding layer 40 bonds the lower surface of the ceramic plate 20 and the upper surface of the cooling plate 30 to each other. The bonding layer 40 may be a metal bonding layer formed of brazing material or a metal brazing material, for example. The metal bonding layer may be formed, for example, by TCB (thermal compression bonding). TCB is a widely known method including placing a metal bonding material between two bonding target members and pressure-bonding the two members heated to a temperature lower than or equal to the solidus line temperature of the metal bonding material. An organic adhesive layer may be employed as the bonding layer 40 instead of the metal bonding layer.

The terminal 50 is a metal member that supplies power to the electrostatic electrode 22. The terminal 50 is, for example, a metal rod. Examples of the metal forming the terminal 50 include W, Mo, and Ni. The metal preferably has a coefficient of thermal expansion close to that of the ceramic plate 20. The terminal 50 is inserted through the lower surface of the cooling plate 30 to extend through the cooling plate through hole 34, which extends through the cooling plate 30 in the vertical direction, and the bonding layer through hole 44, which extends through the bonding layer 40 in the vertical direction, to the terminal hole 24 in the ceramic plate 20. The terminal 50 is electrically connected to the electrostatic electrode 22.

The structure of bonding the terminal 50 to the electrostatic electrode 22 will be explained with reference to FIG. 2. The terminal 50 extends through an insulating sleeve 36 placed in the cooling plate through hole 34 and the bonding layer through hole 44 and is inserted in the terminal hole 24 with a gap therebetween. The terminal 50 is electrically connected to the electrode lead-out portion 23, which is attached to the electrostatic electrode 22, via a conductive bonding portion 55. The conductive bonding portion 55 may be a metal bonding layer formed of solder or a metal brazing material, for example.

The electrode lead-out portion 23 is embedded in the ceramic plate 20 and has a disc shape extending downward from the electrostatic electrode 22. The electrode lead-out portion 23 is formed of a material containing a metal, such as W, Mo, WC, or MoC. The metal forming the electrode lead-out portion 23 preferably has a coefficient of thermal expansion close to that of the ceramic plate 20. The electrode lead-out portion 23 may contain the ceramic contained in the ceramic plate 20 to make the coefficient of thermal expansion of the electrode lead-out portion 23 closer to that of the ceramic plate 20. The electrode lead-out portion 23 may be formed of the same material as the electrostatic electrode 22. The electrode lead-out portion 23 is in the shape of a spherical segment and has a lateral surface 23a that tapers toward the lower side. The electrode lead-out portion 23 is exposed at a bottom surface 24b of the terminal hole 24.

The terminal hole 24 is a cylindrical hole and extends from the lower surface of the ceramic plate 20 to the electrode lead-out portion 23. The terminal hole 24 has a terminal hole tapering surface 24a that tapers toward the bottom of the hole. The terminal hole tapering surface 24a is located between the bottom surface 24b and a lateral surface 24c of the terminal hole 24 and is a C-chamfered surface (taper surface) obtained by C-chamfering the boundary edge between the bottom surface 24b and the lateral surface 24c of the terminal hole 24.

Figure 8:
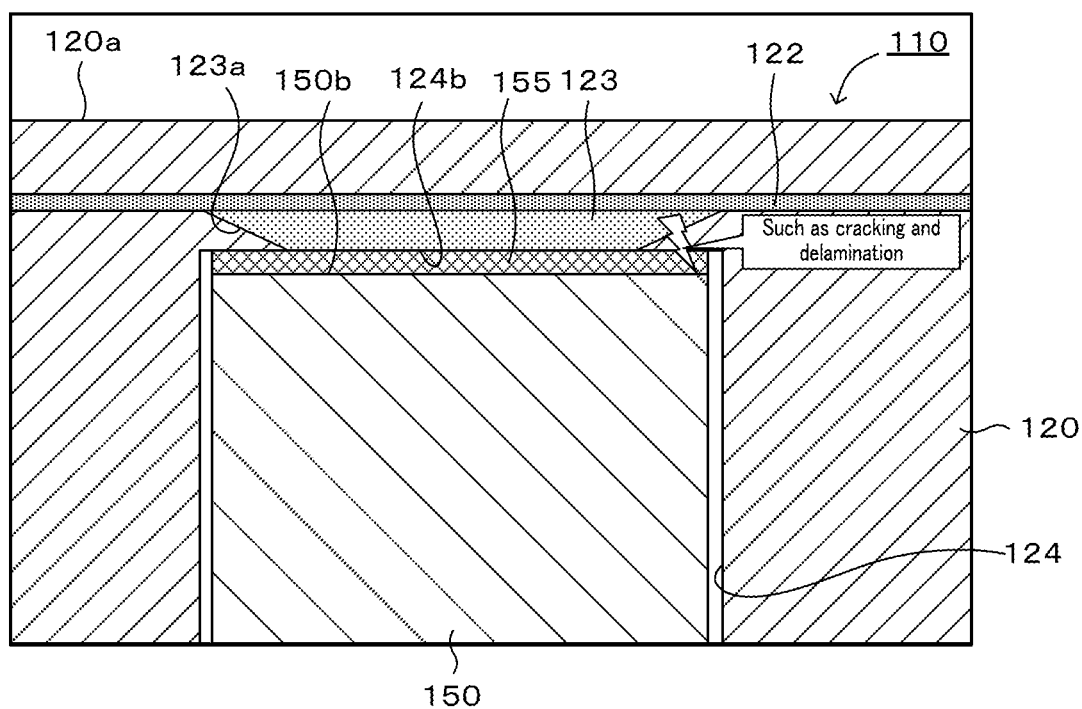
FIG. 8 is a partial magnified view illustrating a wafer placement table 110 of a comparative embodiment.

The terminal hole tapering surface 24a intersects the lateral surface 23a of the electrode lead-out portion 23 at an intersection 25. This can reduce damage in the wafer placement table 10. This point will be explained below. FIG. 8 is a partial magnified view of a wafer placement table 110 of a comparative embodiment (embodiment of the conventional technology disclosed in PTL 1). In the wafer placement table 110, a terminal 150 is electrically connected to an electrode lead-out portion 123, which is embedded in a ceramic plate 120 together with an electrostatic electrode 122, via a conductive bonding portion 155. The electrode lead-out portion 123 has a truncated conical shape, and the lateral surface 123a tapers toward the lower side. The electrode lead-out portion 123 is exposed at the bottom surface 124b of the terminal hole 124. The terminal hole 124 is a cylindrical hole and extends from the lower surface of the ceramic plate 120 to the electrode lead-out portion 123. In this wafer placement table 110, the bottom surface 124b of the terminal hole 124 is flat, and the bottom surface 124b of the terminal hole 124 intersects the lateral surface 123a of the electrode lead-out portion 123. Thus, the ceramic plate 120 has a thin portion between the slanting lateral surface 123a of the electrode lead-out portion 123 and the flat bottom surface 124b of the terminal hole 124. The portion may be damaged, for example, cracked or delaminated by a load caused during formation of the terminal hole 124 or during bonding between the electrostatic electrode 122 and the terminal 150. In contrast, in the wafer placement table 10 of the present embodiment, a portion of the ceramic plate 20 between the electrode lead-out portion 23 and the terminal hole 24 can be made thicker by the amount corresponding to the amount of slant of the terminal hole tapering surface 24a, e.g., by the angle α described below. Thus, the ceramic plate 20 is less likely to have a thin potion, reducing damage in the wafer placement table 10.

At the intersection 25 between the terminal hole tapering surface 24a and the lateral surface 23a of the electrode lead-out portion 23, an angle α between the virtual plane P parallel to the electrostatic electrode 22 and the terminal hole tapering surface 24a is preferably, for example, 20° or greater and 75° or less. The intersection angle β between the terminal hole tapering surface 24a and the lateral surface 23a of the electrode lead-out portion 23 is preferably 40° or greater and 120° or less, for example. The slant angle γ of the lateral surface 23a of the electrode lead-out portion 23 is preferably smaller than the intersection angle β between the terminal hole tapering surface 24a and the lateral surface 23a of the electrode lead-out portion 23. The angles α and β can be obtained, if the terminal hole tapering surface 24a is a curved surface, by using the tangent line of the terminal hole tapering surface 24a at the intersection 25, or if the lateral surface 23a of the electrode lead-out portion 23 is a curved surface, by using the tangent line of the lateral surface 23a of the electrode lead-out portion 23 at the intersection 25. The angle γ can be obtained, if the lateral surface 23a of the electrode lead-out portion 23 is a curved surface, by using the tangent line of the lateral surface 23a of the electrode lead-out portion 23 at the point where the lower surface of the electrostatic electrode 22 intersects the lateral surface 23a of the electrode lead-out portion 23.

The terminal hole tapering surface 24a has a portion in the electrode lead-out portion 23. Thus, the electrode lead-out portion 23 is exposed not only at the bottom surface 24b of the terminal hole 24 but also at a portion of the terminal hole tapering surface 24a.

The terminal 50 has a terminal tapering surface 50a that tapers toward the tip. The terminal tapering surface 50a is located between a front-end surface 50b and a lateral surface 50c of the terminal 50 and is a C-chamfered surface (taper surface) obtained by C-chamfering the boundary edge between the front-end surface 50b and the lateral surface 50c of the terminal 50. The conductive bonding portion 55 is located not only between the bottom surface 24b of the terminal hole 24 and the front-end surface 50b of the terminal 50 but also between the terminal hole tapering surface 24a and the terminal tapering surface 50a. The terminal hole tapering surface 24a and the terminal tapering surface 50a are bonded together by the conductive bonding portion 55. With this configuration, the terminal 50 is bonded to the electrode lead-out portion 23 at the portions exposed at the bottom surface 24b and the terminal hole tapering surface 24a of the terminal hole 24 and also to the ceramic plate 20.

Next, a usage example of the wafer placement table 10 will be described. First, the wafer placement table 10 is disposed in a vacuum chamber (not illustrated), and then a wafer W is placed on a wafer placement surface 20a of the wafer placement table 10. Then, the DC power supply 62 applies a voltage to the electrostatic electrode 22 via the terminal 50. This allows the wafer W to be attracted and fixed to the wafer placement surface 20a. Then, the inside of the vacuum chamber is made to have a vacuum atmosphere or a reduced-pressure atmosphere, and the wafer W is processed in the vacuum chamber. For example, the wafer W may be treated with plasma. In such a case, a top electrode having a shower head is placed on the ceiling of the vacuum chamber, and, while reaction gas is supplied from the shower head to the space between the wafer W and the top electrode, a high-frequency voltage is applied between the top electrode and the cooling plate 30 to generate plasma. After the processing of the wafer W, the application of voltage to the electrostatic electrode 22 is stopped. This stops the attraction and fixation of the wafer W to the wafer placement surface 20a. A refrigerant is fed to the refrigerant flow path 32 when the wafer W needs to be cooled.

Next, among the steps in the method of producing the wafer placement table 10, the step of bonding the terminal 50 to the electrostatic electrode 22 will be explained with reference to FIGS. 3A to 3D. FIGS. 3A to 3D illustrate the steps.

Figure 3A:
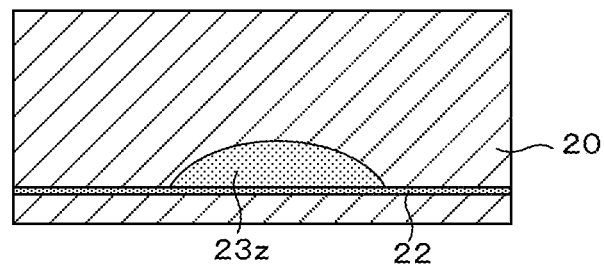
FIGS. 3A to 3D illustrate steps of bonding a terminal 50 to an electrode lead-out portion 23.
Figure 3B:
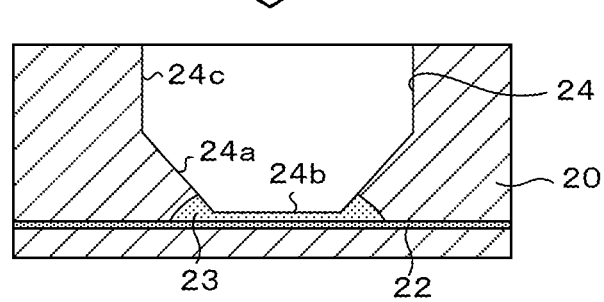

First, the ceramic plate 20 enclosing the electrostatic electrode 22 and a disc member 23z attached to the electrostatic electrode 22 is produced (FIG. 3A). The disc member 23z is a member that becomes the electrode lead-out portion 23 after subsequent drilling. The disc member 23z is in the shape of a spherical cap or a spherical segment that decreases in diameter with increasing distance from the electrostatic electrode 22. The ceramic plate 20 can be produced by the following method, for example. First, two disc-shaped molded bodies formed of ceramic powder are produced. Then, a printed electrode having the shape of the electrostatic electrode 22 is printed on the upper surface of the first disc molded body in concentric with the molded body. At a predetermined position of the upper surface of this printed electrode, a printed electrode having the shape of the disc member 23z is printed. Then, the second disc molded body is stacked on the printed electrode surface of the first disc molded body to form a layered body. The layered body is subjected to hot-press firing, and thus the ceramic plate 20 is produced. In FIGS. 3A to 3D, the surface of the ceramic plate 20 that becomes the wafer placement surface 20a faces downward.

Then, the terminal hole 24 extending from one surface of the ceramic plate 20 to the electrode lead-out portion 23 (FIG. 3B) is formed. The terminal hole 24 has the terminal hole tapering surface 24a located between the bottom surface 24b and the lateral surface 24c. The terminal hole 24 is formed so that the bottom surface 24b and a portion of the terminal hole tapering surface 24a of the terminal hole 24 are in the disc member 23z, allowing the electrode lead-out portion 23 to be exposed at the bottom surface 24b of the terminal hole 24 and the portion of the terminal hole tapering surface 24a. The terminal hole 24 can be formed by a known hole-making process, such as drilling and laser processing, for example.

Figure 3C:
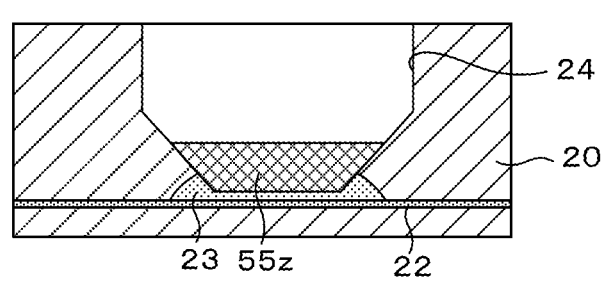

Then, the conductive bonding material 55z is placed on the bottom of the terminal hole 24 (FIG. 3C). The bonding material 55z, which later becomes the conductive bonding portion 55, may be, for example, a metal sheet formed of solder or a metal brazing material.

Figure 3D:
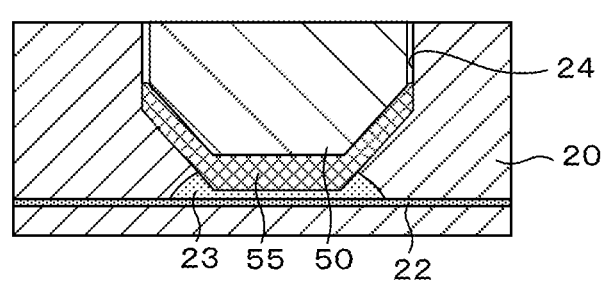

Then, the terminal 50 is placed on the bonding material 55z, and the bonding material 55z is sandwiched between the terminal hole 24 and the terminal 50. When the bonding material 55z in this state is treated at a temperature above the melting point of the bonding material 55z, the bonding material 55z melts and spreads wet between the terminal hole 24 and the terminal 50. When the bonding material 55z in this state solidifies, the conductive bonding portion 55 bonds a portion of the electrode lead-out portion 23 that is exposed at the terminal hole 24 and the terminal 50 together (FIG. 3D). This electrically connects the terminal 50 to the electrostatic electrode 22.

In the wafer placement table 10 described above, the terminal hole 24 has the terminal hole tapering surface 24a that tapers toward the bottom of the hole, and the terminal hole tapering surface 24a intersects the lateral surface 23a of the electrode lead-out portion 23. Thus, the ceramic plate 20 is less likely to have a thin potion, reducing damage in the wafer placement table 10.

Furthermore, the lateral surface 23a of the electrode lead-out portion 23 tapers toward the lower side. This can reduce the volume of the electrode lead-out portion 23 with the sufficient contact area between the electrostatic electrode 22 and the electrode lead-out portion 23 being kept. The reduction in volume of the electrode lead-out portion 23 reduces cracking and delamination of the ceramic plate 20 caused by difference in thermal expansion between the ceramic plate 20 and the electrode lead-out portion 23.

Furthermore, at the intersection 25 between the terminal hole tapering surface 24a and the lateral surface 23a of the electrode lead-out portion 23, an angle $\alpha$ between the virtual plane P parallel to the electrostatic electrode 22 and the terminal hole tapering surface 24a may be 20° or greater and 75° or less. When the angle $\alpha$ is 20° or greater, the ceramic plate 20 is less likely to have a thin portion, and thus cracking and delamination of the ceramic plate 20 can be further reduced. When this angle $\alpha$ is 75° or less, the terminal hole 24 can have a relatively large diameter, even if the bottom of the terminal hole 24 is made small to match the size of the electrode lead-out portion 23, for example. This enables a terminal 50 having a larger diameter to be in the terminal hole 24, ensuring high conductivity.

Still furthermore, the intersection angle $\beta$ between the terminal hole tapering surface 24a and the lateral surface 23a of the electrode lead-out portion 23 may be 40° or greater and 120° or less. When the intersection angle $\beta$ is 40° or greater, the ceramic plate 20 is less likely to have a thin portion, and thus cracking and delamination of the ceramic plate 20 can be further reduced. When this intersection angle is 120° or less, the terminal hole 24 can have a relatively large diameter, even if the bottom of the terminal hole 24 is made small to match the size of the electrode lead-out portion 23, for example. This enables a terminal 50 in the terminal hole 24 to have a larger diameter, ensuring high conductivity.

Furthermore, the slant angle γ of the lateral surface 23a of the electrode lead-out portion 23 may be smaller than the intersection angle β between the terminal hole tapering surface 24a and the lateral surface 23a of the electrode lead-out portion 23. The volume of the electrode lead-out portion 23 decreases as the slant angle γ of the lateral surface 23a of the electrode lead-out portion 23 decreases, and thus cracking and delamination of the ceramic plate 20 caused by difference in thermal expansion between the ceramic plate 20 and the electrode lead-out portion 23 can be further reduced.

Still furthermore, the terminal hole tapering surface 24a has a portion in the electrode lead-out portion 23. Thus, the contact area between the electrode lead-out portion 23 and the conductive bonding portion 55 can be readily secured, improving the conducting properties.

Still furthermore, the terminal hole tapering surface 24a is a C-chamfered surface located between the bottom surface 24b and the lateral surface 24c of the terminal hole 24, the terminal 50 has the terminal tapering surface 50a that tapers toward the tip of the terminal 50, the terminal tapering surface 50a is a C-chamfered surface located between the front-end surface 50b and the lateral surface 50c of the terminal 50, and the terminal hole tapering surface 24a and the terminal tapering surface 50a are bonded together by the conductive bonding portion 55. With this configuration, the C-chamfered terminal tapering surface 50a can be received by and bonded to the C-chamfered terminal hole tapering surface 24a. This reduces concentration of the pressing force applied by the terminal 50 on the bottom surface 24b of the terminal hole 24, reducing cracking and delamination of the ceramic plate 20 around the bottom surface 24b of the terminal hole 24. From the viewpoint of even distribution of the pressing force applied by the terminal 50, the C-chamfered surface of the terminal hole tapering surface 24a and the C-chamfered surface of the terminal tapering surface 50a are preferably similar in size, and the C-chamfered surface of the terminal hole tapering surface 24a and the C-chamfered surface of the terminal tapering surface 50a are preferably similar in slant angle. The C-chamfered surface of each of the terminal hole tapering surface 24a and the terminal tapering surface 50a may have a slant angle of, for example, 30° or greater and 60° or less. The C-chamfered surface of each of the terminal hole tapering surface 24a and the terminal tapering surface 50a may have a size of, for example, 0.3 mm or greater and 2.5 mm or less. The diameter of the bottom surface 24b of the terminal hole 24 may be smaller than the diameter of the lateral surface 50c of the terminal 50, or the diameter of the bottom surface 50b of the terminal 50.

The present invention should not be limited to the above-described embodiment and may be implemented in various modes without departing from the technical scope of the present invention.

Figure 4:
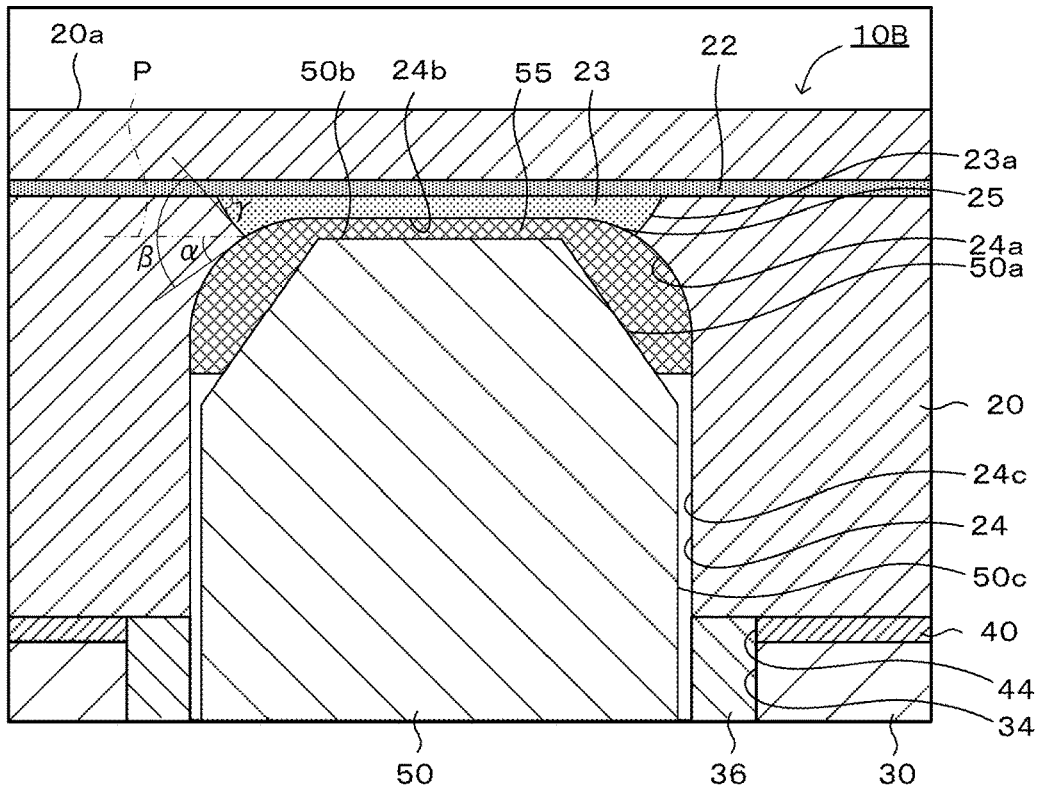
FIG. 4 is a partial magnified view illustrating a wafer placement table 10B of another example.

In the above-described embodiment, the terminal hole tapering surface 24a is a C-chamfered surface obtained by C-chamfering the boundary edge between the bottom surface 24b and the lateral surface 24c of the terminal hole 24, but this should not be construed as limiting. For example, as in a wafer placement table 10B of another example illustrated in FIG. 4, the terminal hole tapering surface 24a may be an R-chamfered surface obtained by R-chamfering the boundary edge between the bottom surface 24b and the lateral surface 24c of the terminal hole 24. Alternatively, the bottom surface 24b of the terminal hole 24 may be an R-chamfered surface, and a portion of the R-chamfered bottom surface 24b may be the terminal hole tapering surface 24a. The radius of curvature of the R-chamfered surface of the terminal hole tapering surface 24a may be, for example, 0.3 mm or greater and 2.5 mm or less. In FIG. 4, the same symbols are assigned to the same components as those in the above-described embodiment.

Figure 5:
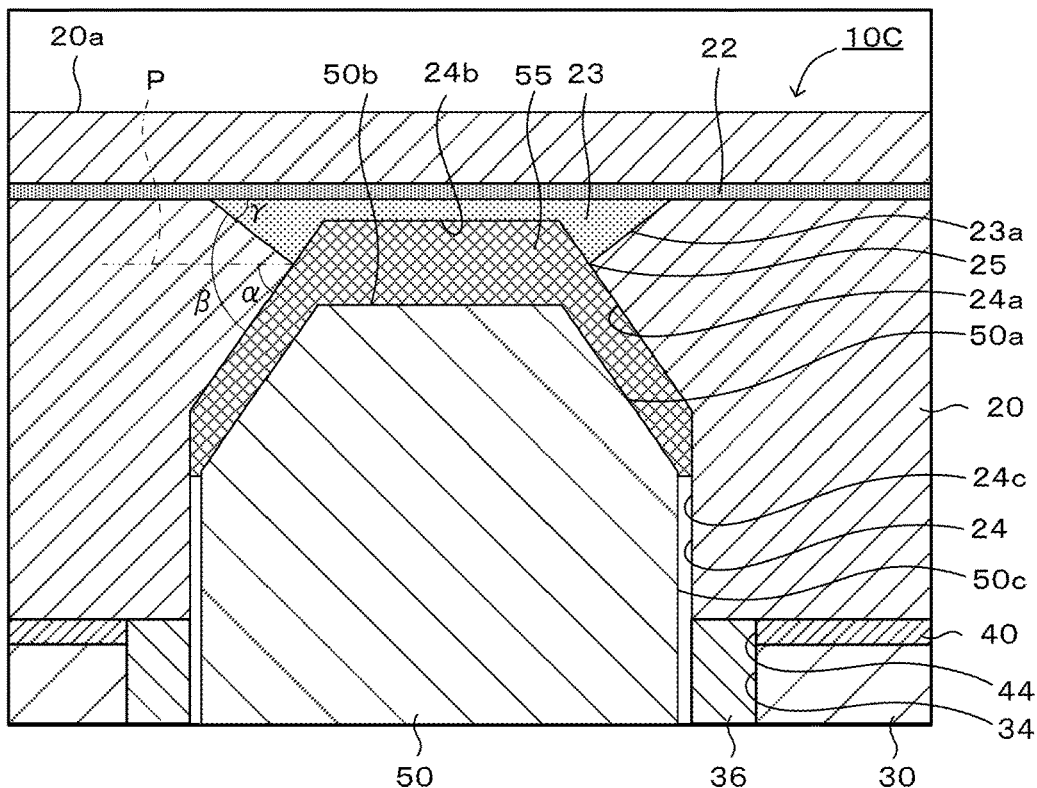
FIG. 5 is a partial magnified view illustrating a wafer placement table 10C of another example.
Figure 6:
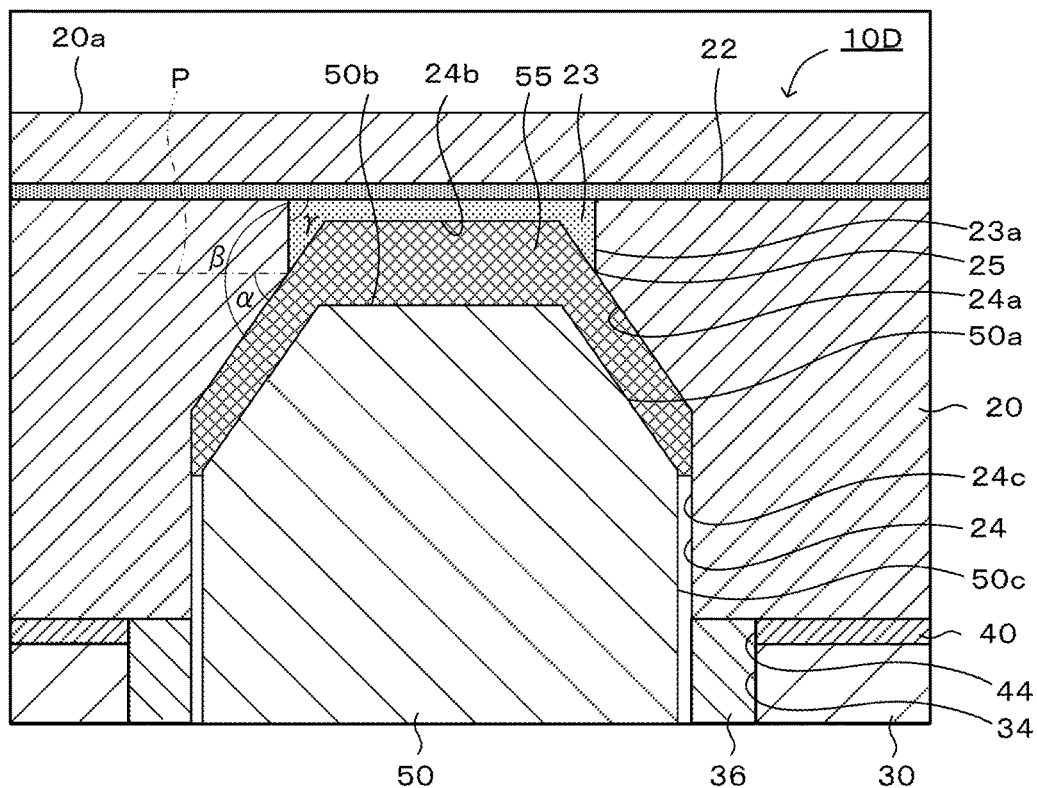
FIG. 6 is a partial magnified view illustrating a wafer placement table 10D of another example.

In the embodiment and another example described above, the electrode lead-out portion 23 is in the shape of a spherical segment, but this should not be construed as limiting. For example, the electrode lead-out portion 23 may have a truncated conical shape as a wafer placement table 10C of another example illustrated in FIG. 5. In such a case, a conical or truncated conical shaped member is used as the disc member 23z in the step of bonding the terminal 50 and the electrostatic electrode 22 together. Alternatively, the electrode lead-out portion 23 may have a cylindrical shape as a wafer placement table 10D of another example illustrated in FIG. 6. In such case, a cylindrical member may be used as the disc member 23z in the step of bonding the terminal 50 and the electrostatic electrode 22 together. In FIGS. 5 and 6, the same symbols are assigned to the same components as those in the above-described embodiment.

Figure 7:
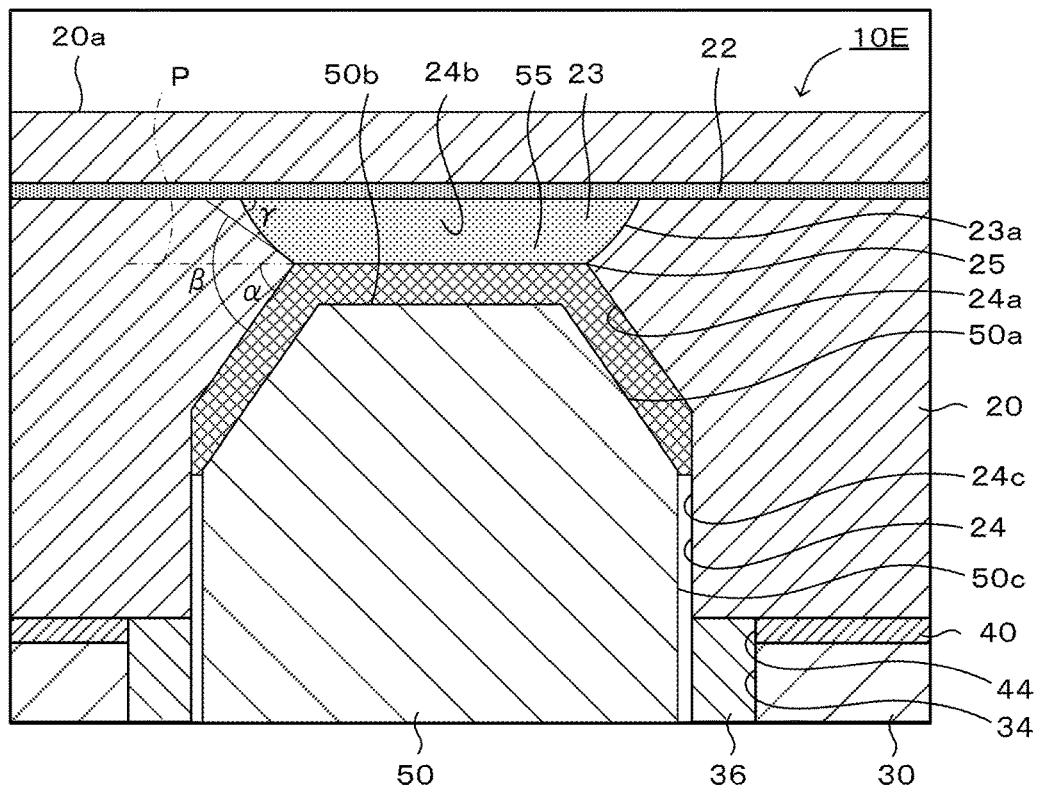
FIG. 7 is a partial magnified view illustrating a wafer placement table 10E of another example.

In the embodiments and examples described above, the terminal hole tapering surface 24a has a portion in the electrode lead-out portion 23, but this should not be construed as limiting. For example, as in a wafer placement table 10E of another example illustrated in FIG. 7, the terminal hole tapering surface 24a may be in contact with the lateral surface 23a of the electrode lead-out portion 23 without having a portion in the electrode lead-out portion 23. In FIG. 7, the same symbols are assigned to the same components as those in the above-described embodiment.

In the embodiment and examples described above, the terminal tapering surface 50a is a C-chamfered surface obtained by C-chamfering the boundary edge between the front-end surface 50b and the lateral surface 50c of the terminal 50, but this should not be construed as limiting. For example, the terminal tapering surface 50a may be an R-chamfered surface obtained by R-chamfering the boundary edge between the front-end surface 50b and the lateral surface 50c of the terminal 50. Alternatively, the front-end surface 50b of the terminal 50 may be an R-chamfered surface, and a portion of the R-chamfered front-end surface 50b may be the terminal tapering surface 50a. The radius of curvature of the R-chamfered surface of the terminal tapering surface 50a may be, for example, 0.3 mm or greater and 2.5 mm or less. The terminal 50 may have no terminal tapering surface 50a, and the front-end surface 50b and the lateral surface 50c may intersect at a right angle.

In the embodiment and examples described above, the conductive bonding portion 55 is only required to bond and electrically connect the terminal 50 and the electrode lead-out portion 23 together and may be located only between a portion of the electrode lead-out portion 23 that is exposed at the bottom surface 24b of the terminal hole 24 and the front-end surface 50b of the terminal 50 or only between a portion of the electrode lead-out portion 23 that is exposed at the terminal hole tapering surface 24a and the terminal tapering surface 50a.

In the embodiment and examples described above, a metal rod was described as an example of the terminal 50, but this should not be construed as limiting. The terminal 50 may be a metal cable, for example.

In the embodiment and examples described above, the wafer placement table 10 may have at least one of a heater electrode or an RF electrode (electrode for plasma generation) in the ceramic plate 20, instead of or in addition to the electrostatic electrode 22. In such a case, the structure of bonding the heater electrode to the terminal for the heater electrode and the structure of bonding the RF electrode to the terminal for the RF electrode may be the same as the above-described structure of bonding the electrostatic electrode 22 to the terminal 50.

International Application No. PCT/JP2023/030114, filed on Aug. 22, 2023, is incorporated herein by reference in its entirety.

What is claimed is:

1. A member for semiconductor manufacturing apparatus comprising:
    a ceramic plate having a wafer placement surface on an upper surface;
    an electrode embedded in the ceramic plate;
    an electrode lead-out portion embedded in the ceramic plate and extending downward from the electrode;
    a terminal hole extending from a lower surface of the ceramic plate to the electrode lead-out portion;
    a terminal in the terminal hole; and
    a conductive bonding portion located between the terminal and the electrode lead-out portion and bonding the terminal and the electrode lead-out portion together, wherein
    the terminal hole has a terminal hole tapering surface that tapers toward a bottom of the terminal hole, and the terminal hole tapering surface intersects a lateral surface of the electrode lead-out portion.

2. The member for semiconductor manufacturing apparatus according to claim 1, wherein the lateral surface of the electrode lead-out portion tapers toward a lower side.

3. The member for semiconductor manufacturing apparatus according to claim 1, wherein, at an intersection between the terminal hole tapering surface and the lateral surface of the electrode lead-out portion, an angle between a virtual plane parallel to the electrode and the terminal hole tapering surface is 20° or greater and 75° or less.

4. The member for semiconductor manufacturing apparatus according to claim 1, wherein an intersection angle between the terminal hole tapering surface and the lateral surface of the electrode lead-out portion is 40° or greater and 120° or less.

5. The member for semiconductor manufacturing apparatus according to claim 4, wherein the lateral surface of the electrode lead-out portion tapers toward a lower side, and the lateral surface of the electrode lead-out portion has a slant angle smaller than the intersection angle between the terminal hole tapering surface and the lateral surface of the electrode lead-out portion.

6. The member for semiconductor manufacturing apparatus according to claim 1, wherein the terminal hole tapering surface has a portion in the electrode lead-out portion.

7. The member for semiconductor manufacturing apparatus according to claim 1, wherein the terminal hole tapering surface is a C-chamfered surface or an R-chamfered surface located between a bottom surface and a lateral surface of the terminal hole.

8. The member for semiconductor manufacturing apparatus according to claim 1, wherein
    the terminal hole tapering surface is a C-chamfered surface located between a bottom surface and a lateral surface of the terminal hole,
    the terminal has a terminal tapering surface that tapers toward a tip of the terminal,
    the terminal tapering surface is a C-chamfered surface located between a front-end surface and a lateral surface of the terminal, and
    the terminal hole tapering surface and the terminal tapering surface are bonded together by the conductive bonding portion.

* * * * *